United States Patent
Su et al.

(10) Patent No.: US 8,367,936 B2
(45) Date of Patent: Feb. 5, 2013

(54) FLEXIBLE PRINTED CIRCUIT BOARD AND METHOD FOR FORMING MONITOR

(75) Inventors: Xin Su, Shenzhen (CN); Sai-Xin Guan, Shenzhen (CN); Yin Zhang, Shenzhen (CN)

(73) Assignees: Innocom Technology (Shenzhen) Co., Ltd., Shenzhen (CN); Chimei Innolux Corporation, Miao-Li County (TW)

( * ) Notice: Subject to any disclaimer, the term of this patent is extended or adjusted under 35 U.S.C. 154(b) by 0 days.

(21) Appl. No.: 12/873,268

(22) Filed: Aug. 31, 2010

(65) Prior Publication Data

US 2011/0067905 A1  Mar. 24, 2011

(30) Foreign Application Priority Data

Sep. 22, 2009  (CN) .......................... 2009 1 0307443

(51) Int. Cl.
*H05K 1/00* (2006.01)
(52) U.S. Cl. ................ 174/254; 174/260; 174/261
(58) Field of Classification Search .......... None
See application file for complete search history.

(56) References Cited

U.S. PATENT DOCUMENTS

| 5,161,009 | A  | * | 11/1992 | Tanoi et al. | 349/150 |
| 5,168,430 | A  |   | 12/1992 | Nitsch et al. | |
| 5,404,239 | A  | * | 4/1995 | Hirai | 349/150 |
| 7,348,492 | B1 | * | 3/2008 | Kawai et al. | 174/254 |
| 7,572,982 | B2 | * | 8/2009 | Joon | 174/254 |
| 7,580,103 | B2 | * | 8/2009 | Kawaguchi | 349/150 |
| 7,649,144 | B2 | * | 1/2010 | Honjo | 174/254 |
| 2006/0109394 | A1 | * | 5/2006 | Miyagawa et al. | 349/58 |

FOREIGN PATENT DOCUMENTS

CN  201174842 Y  12/2008

* cited by examiner

*Primary Examiner* — Ishwarbhai Patel
(74) *Attorney, Agent, or Firm* — WPAT PC; Justin King

(57) ABSTRACT

The disclosure relates to a flexible printed circuit board and a method for manufacturing a monitor. The flexible printed circuit board is disposed on a portion of an upper surface of a substrate and is folded to a sidewall and a lower surface of the substrate. The flexible printed circuit board includes a flexible substrate and an insulating layer surrounding the flexible substrate. The insulating layer has an opening at least exposing a portion of the flexible substrate situated relative to the sidewall of the substrate.

19 Claims, 4 Drawing Sheets

FLEXIBLE PRINTED CIRCUIT BOARD AND METHOD FOR FORMING MONITOR

BACKGROUND

1. Technical Field

The disclosure relates in general to a flexible printed circuit board, and more particularly to a structure that uses an insulating layer to prevent the flexible printed circuit board from rupture.

2. Description of Related Art

Flat display modules have gained great popularity nowadays. Due to the features of slimness, low power consumption and low radiation, a liquid crystal display (LCD) has been widely used in portable electronic devices such as desktop computer, notebook computer, personal digital assistant (PDA), and mobile phone, and even gradually replaces cathode ray tube (CRT) monitor and conventional TV.

To satisfy the requirements of slimness and light weight expected of portable electronic products, manufacturers have to install various elements within limited internal space of the products. In general, the LCD panel is connected to external signals through a flexible printed circuit (FPC) board for controlling the frame of the display panel. Since the flexible printed circuit board has flexibility, the FPC can be folded backward to fit the internal space of the module and save the internal space of the LCD panel. Examples of flexible printed circuit boards known in the art can be found in U.S. Pat. No. 7,348,492 B1 and U.S. Patent Application Publication No. 2006/0109394 A1.

However, the currently used flexible printed circuit boards usually are a single-, double- or multi-layered structure. Since the flexible printed circuits of the electronic products need to be folded during assembly or use, the flexible printed circuit board with a thinner or weaker structure may easily be cut off by the glass edge of the LCD panel or ruptured due to the flecturing force. Under most circumstances, rupture may easily occur to the junction between the edges of the flexible printed circuit board and the glass substrate of the LCD panel or to the turning corners of the flexible printed circuit board. No matter rupture occurs to what position or in what manner, the operation of the overall LCD module will be severely affected, or may even incapacitate the normal operation of the LCD module.

SUMMARY

The disclosure relates to a flexible printed circuit board, which resolves the problem that rupture may easily occur to the flexible circuit board. The disclosure prevents the occurrence of rupture without hardening the flexible printed circuit board or increasing the thickness significantly.

A flexible printed circuit board is disclosed in a specific embodiment of the disclosure. The flexible printed circuit board is disposed on a portion of an upper surface of a substrate and is folded to a lower surface of the substrate. The flexible printed circuit board mainly includes a flexible substrate and an insulating layer surrounding the flexible substrate. The insulating layer has an opening at least exposing a portion of the flexible substrate situated relative to a sidewall of the substrate.

The disclosure will become apparent from the following detailed description of the specific but non-limiting embodiments. The following description is made with reference to the accompanying drawings.

DETAILED DESCRIPTION

Figure 1:
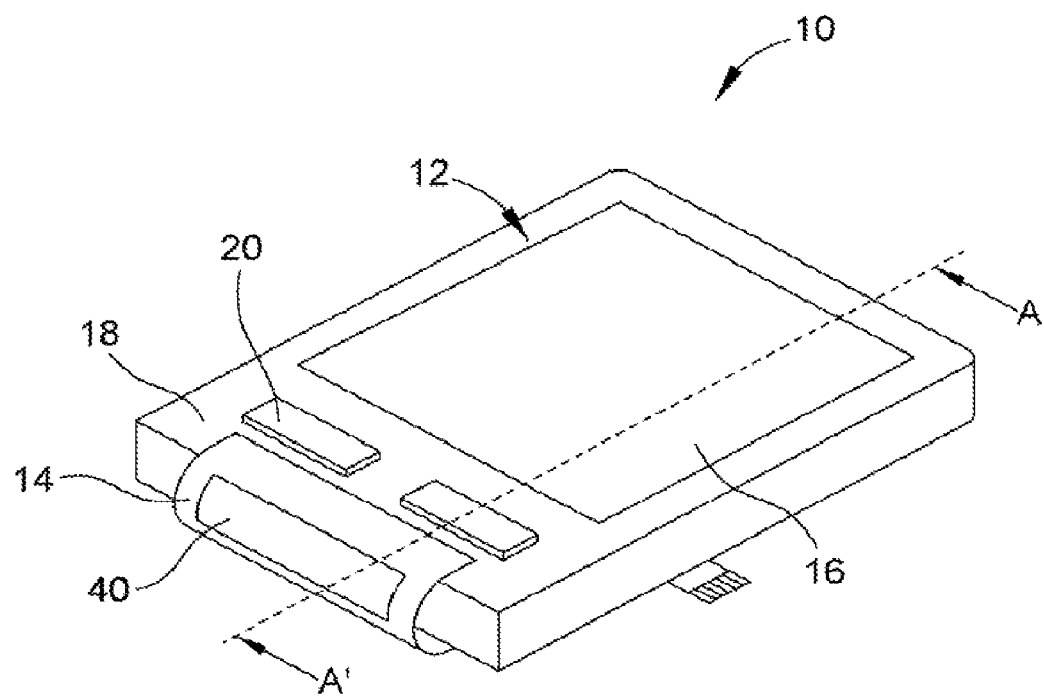
FIG. 1 shows a display module according to a specific embodiment of the disclosure.
Figure 2:
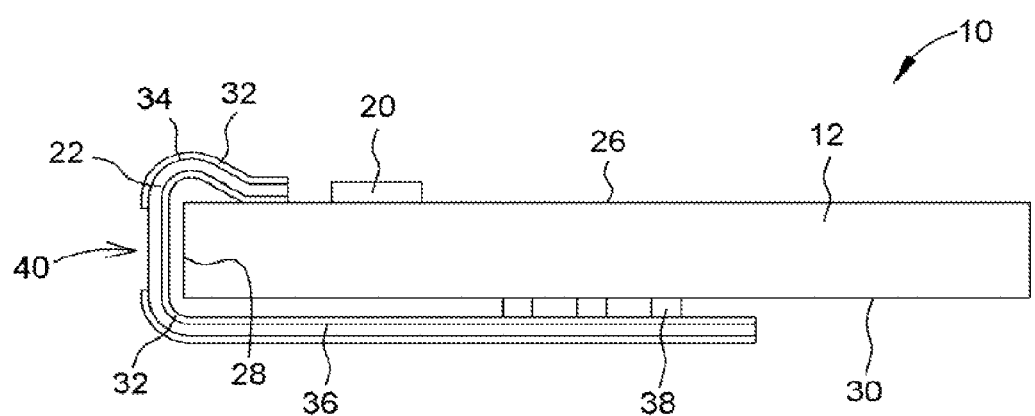
FIG. 2 shows a cross-sectional view along an AA' line of the display module of FIG. 1.

Referring to FIG. 1 and FIG. 2, FIG. 1 shows a display module 10 according to a specific embodiment of the disclosure, and FIG. 2 shows a cross-sectional view along an AA' line of the display module of FIG. 1. As indicated in the diagram, the display module 10 mainly includes a substrate 12 and a flexible printed circuit board 14 disposed on the substrate 12. The substrate 12 mainly includes a display panel such as a liquid crystal display (LCD) panel or a touch panel, wherein the substrate 12 has an upper surface 26, at least a sidewall 28 and a lower surface 30. The upper surface 26 of the substrate 12 has a display region 16 and a peripheral circuit region 18, wherein several driving chips 20 are disposed on the peripheral circuit region 18 of the substrate 12 for driving the substrate 12. The driving chip 20 may be an integrated gate-driving chip or a source-driving chip. The driving chip 20 may be attached onto the substrate 12 by a chip on glass (COG) packaging method.

The flexible printed circuit board 14 of the present embodiment, mainly includes a single-layered flexible substrate 22 and an insulating layer 32 surrounding a portion of the flexible substrate 22. The flexible printed circuit board 14 is disposed on a portion of the upper surface 26 of the substrate 12 and folded to the sidewall 28 and the lower surface 30 of the substrate 12. In the present embodiment of the disclosure, the flexible printed circuit board 14 is folded to the sidewall 28 and the lower surface 30 of the substrate 12 but the flexible printed circuit board 14 is not limited to the folding design and thus can be applied to an unfolded module such as a slide type electronic device. The flexible substrate 22 has a first surface 34 and a second surface 36 with respect to the upper surface 26 and the lower surface 30 of the substrate 12. When the flexible printed circuit board 14 is folded, the second surface 36 is closer to the sidewall 28 of the substrate 12 than the first surface 34. In addition, a plurality of electronic elements 38 may be disposed on the second surface 36 of the flexible substrate 22 for controlling the operation of the display module 10. The insulating layer 32 may surround a portion of the first surface 34 and a portion of the second surface 36 of the flexible substrate 22 at the same time. However, the disclosure is not limited thereto. Probably, the insulating layer 32 may surround merely a portion of the first surface 34 of the flexible substrate 22 or merely a portion of the second surface 36 of the flexible substrate 22, and such design is still within the scope of protection of the disclosure.

According to a specific embodiment of the disclosure, the insulating layer 32 is composed of a polyimide film. However, the disclosure is not limited thereto, and thus the insulating layer may be formed by other insulating materials possessing protection effect. Also, when the insulating layer 32 surrounds the flexible substrate 22, an opening 40 exposing a portion of the flexible substrate 22 situated relative to the sidewall 28 of the substrate 12 is preferably formed. In addition, the flexible printed circuit board 14 itself of the present embodiment further includes a circuit region and a non-circuit region, wherein the circuit region has a plurality of wires for electrically connecting the driving chip 20 or other electronic elements on the substrate 12 as well as the electronic elements 38 of the flexible substrate 22. The opening 40 of the insulating layer 32 exposes the non-circuit region of the flexible printed circuit board 14.

Figure 3:
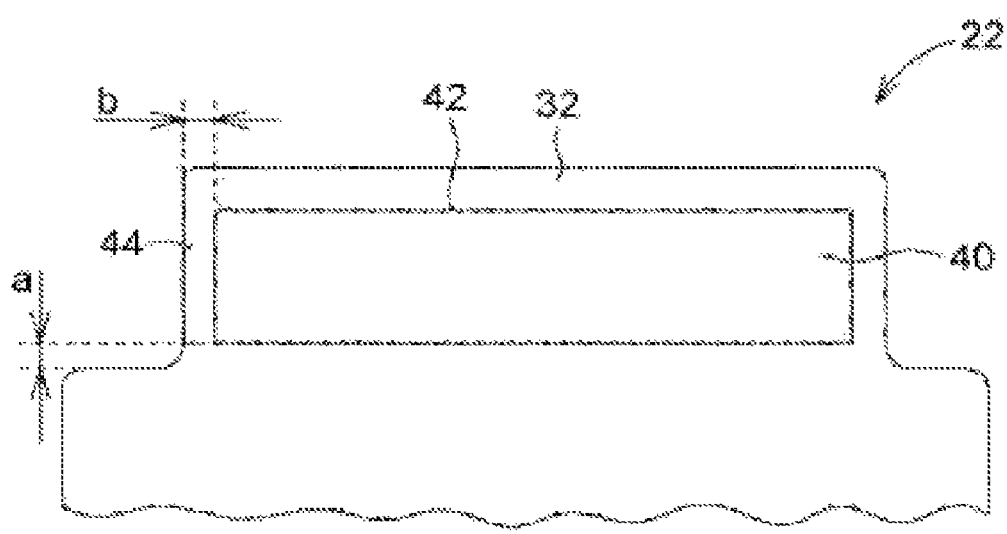
FIG. 3 shows an enlarged view of a first surface of a flexible substrate.
Figure 4:
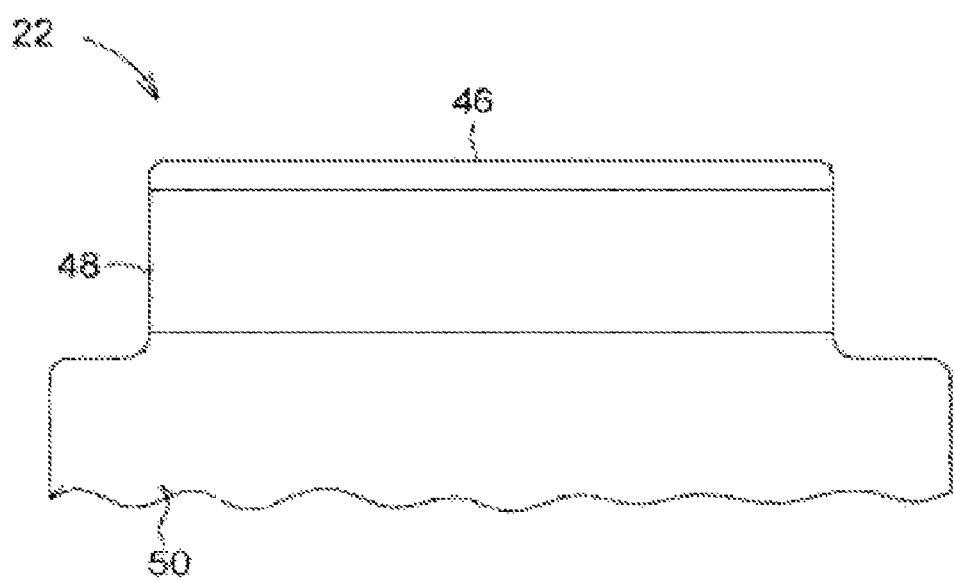
FIG. 4 shows an enlarged view of a second surface of a flexible substrate.

Referring to FIG. 3 and FIG. 4 at the same time, FIG. 3 shows an enlarged view of the first surface 34 of the flexible substrate 22 not fixed on the substrate 12. FIG. 4 shows an enlarged view of the second surface 36 of the flexible substrate 22. FIGS. 3 and 4 together with the disposition of the insulating layer 32 on the flexible substrate 22 are disclosed below for elaborating the details of the disclosure.

As indicated in FIG. 3, the insulating layer 32 surrounds the periphery of the first surface 34 of the flexible substrate 22 situated relative to the sidewall 28 of the substrate 12, and the opening 40 of the insulating layer 32 is a rectangular opening 40 disposed at the central position of the flexible substrate 22 relative to the central position of the sidewall 28 of the substrate 12. Note that, despite the opening 40 being disposed at the central position of the flexible substrate 22 relative to the central position of the sidewall 28 of the substrate 12, the disposition of the opening 40 is not limited thereto, and the position and the size of the opening 40 can be adjusted according to actual needs. For example, the opening 40 can be disposed in the part of the flexible substrate 22 relative to the sidewall 28 of the substrate 12 and at the same time can be extended to the position of the flexible substrate 22 relative to the upper surface 26 and/or the lower surface 30 of the substrate 12.

In addition, the portion of the flexible substrate 22 exposed by the opening 40 belongs to the non-circuit region, and the portion of the flexible substrate 22 surrounded by the insulating layer 32 at the periphery of the opening 40 belongs to the circuit region. In other words, the disposition of the insulating layer 32 protects the wires of the flexible printed circuit board 14, and the opening 40 of the insulating layer 32 provides a space for folding such that the flexible printed circuit board 14, when being folded to the lower surface 30 of the substrate 12, will not be ruptured by the exposed wires.

In the present embodiment of the disclosure, the opening 40 is exemplified by a rectangular opening, but the shape of the opening 40 is not limited thereto and can have other shapes such as circular or square and so on to fit the needs of the products. In the present embodiment of the disclosure, the rectangular opening 40 has a long side 42 and at least a short side 44, wherein a distance "a" from the long side 42 to a site of the flexible substrate 22 corresponding to a border site between the lower surface 30 and the sidewall 28 of the substrate 12 is smaller than 0.5 mm, and a distance "b" from the short side 44 to the edge of the insulating layer 32 is smaller than 0.8 mm. However, the disclosure is not limited to the above exemplification, and the above distances can be adjusted to fit actual needs of the products, and are still within the scope of protection of the disclosure.

As indicated in FIG. 4, the flexible substrate 22 mainly includes three regions 46/48/50. The region 46 is the region where the second surface 36 of the flexible substrate 22 is attached to a portion of the upper surface 26 of the substrate 12. The region 48 is the region where the second surface 36 of the flexible substrate 22 corresponds to the sidewall 28 of the substrate 12. The region 50 is the region where the second surface 36 of the flexible substrate 22 corresponds to the lower surface 30 of the substrate 12. In the present embodiment of the disclosure, all of the regions 46/48/50 include at least a portion of the circuit region, so the insulating layer 32 surrounds a great portion of the second surface 36 of the flexible substrate 22 such as regions 46/48/50. However, the disclosure is not limited thereto, and the insulating layer 32 can selectively surround the region 46, 48 or 50 according to actual needs of the products, and such design is still within the scope of protection of the disclosure.

Based on the structures disclosed in FIGS. 1-4, the disclosure also discloses a manufacturing method for a flexible printed circuit board 14. The flexible printed circuit board 14, applied to a substrate 12 realized by a display panel such as an LCD panel or a touch panel, includes a flexible substrate 22 and an insulating layer 32. In the manufacturing method of the present embodiment of the disclosure, an insulating layer 32 having at least an opening 40 is formed by a stamping method using a mold. Then, the insulating layer 32 is attached onto the flexible substrate 22.

In addition, based on the structure disclosed in the above embodiments, the disclosure also discloses a manufacturing method for a monitor. Firstly, an insulating layer 32 having at least an opening 40 is formed by a stamping method using a mold. Then, the insulating layer 32 is attached on to the flexible substrate 22. Next, one side of the flexible substrate 22 with the insulating layer 32 is fixed to an upper surface 26 of a substrate 12 (such as an LCD panel or a touch panel and so on). Then, the flexible substrate 22 is folded such that the other side of the flexible substrate 22 is close to a lower surface 30 of the substrate 12.

Accordingly, in the present disclosure, a flexible substrate is surrounded by an insulating layer composed of a polyimide film, and an opening at least exposing a portion of the flexible substrate situated relative to the sidewall of the substrate is formed in the insulating layer. The insulating layer, which has an opening and surrounds the flexible substrate, provides an enhancement and shielding effect to the edge and the turning corner of flexible printed circuit board, such that the flexible substrate, when being folded, will not rupture or crack due to thinness and weakness of the structure itself. Meanwhile, the flexible substrate will not be cut off by the glass edge of the LCD panel, and the flexible substrate can endure higher flecturing force for more times. Through the design of surrounding the flexible substrate with an insulating layer having an opening, the disclosure largely enhance the anti-rupturing strength and the flecturability of the single-layered flexible printed circuit board and at the same time maintain the restoring force and flecturability of the single-, double- and multi-layered flexible printed circuit board, and further improves the reliability and stability of the overall display module.

While the disclosure has been described by way of example and in terms of a specific embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A flexible printed circuit board, a part of the flexible printed circuit board disposed on a portion of an upper surface of a substrate with another part of the flexible printed circuit board being bent around a sidewall of the substrate and still another part of the flexible printed circuit board being disposed opposite a lower surface of the substrate, wherein the flexible printed circuit board comprises:
   a flexible substrate comprising a first surface and a second surface at opposite sides thereof, the second surface being closer to the sidewall than the first surface; and
   an insulating layer attached to and surrounding the flexible substrate at least a part of at least one of the first surface and the second surface of the flexible substrate, wherein the insulating layer has an opening exposing a portion of one of said at least one of the first surface and the second surface of the flexible substrate, the opening situated corresponding to the sidewall, and the insulating layer is extended from the top surface to the bottom surface of the substrate via two ends of the opening.

2. The flexible printed circuit board according to claim 1, wherein the opening is a rectangular opening having two long sides and two short sides.

3. The flexible printed circuit board according to claim 2, wherein a distance from the long side to a site of the flexible substrate corresponding to a border between the lower surface and the sidewall of the substrate is smaller than 0.5 mm.

4. The flexible printed circuit board according to claim 3, wherein a distance from the short side to an outer lateral edge of the insulating layer is smaller than 0.8 mm.

5. The flexible printed circuit board according to claim 1, wherein the insulating layer comprises a polyimide film.

6. The flexible printed circuit board according to claim 1, wherein the substrate comprises a liquid crystal display (LCD) panel.

7. The flexible printed circuit board according to claim 1, wherein the flexible substrate is a single-layered flexible substrate.

8. The flexible printed circuit board according to claim 7, wherein the insulating layer is attached to a part of the first surface of the flexible substrate and surrounds a portion of the first surface of the flexible substrate, and the opening exposes the portion of the first surface of the flexible substrate.

9. The flexible printed circuit board according to claim 8, further comprising a plurality of electronic elements disposed on the second surface of the flexible substrate.

10. The flexible printed circuit board according to claim 8, wherein the insulating layer is further attached to substantially the entire second surface of the flexible substrate.

11. The flexible printed circuit board according to claim 8, wherein the insulating layer is further attached a part of the second surface of the flexible substrate and surrounds a portion of the second surface of the flexible substrate, the insulating layer has another opening exposing a portion of the second surface of the flexible substrate, and the another opening is situated corresponding to the sidewall.

12. The flexible printed circuit board according to claim 7, wherein the insulating layer is attached to a part of the second surface of the flexible substrate and surrounds a portion of the second surface of the flexible substrate, and the opening exposes the portion of the second surface of the flexible substrate.

13. A flexible printed circuit board, comprising:
a first part disposed on a portion of an upper surface of a substrate;
a second part adjacent to the first part and bent around a sidewall of the substrate; and
a third part adjacent to the second part and disposed opposite a lower surface of the substrate;
wherein the flexible printed circuit board further comprises:
a flexible substrate comprised in all of the first, second and third parts, and comprising a first surface and a second surface at opposite sides thereof, the second surface being closer to the sidewall than the first surface; and
an insulating layer attached to at least a part of the first surface of the flexible substrate, wherein the insulating layer has an opening exposing a portion of the first surface of the flexible substrate, the opening situated at the second part and corresponding to the sidewall and the insulating layer is extended from the top surface to the bottom surface of the substrate via two ends of the opening.

14. The flexible printed circuit board according to claim 13, wherein the insulating layer includes a portion located on a periphery of the first surface of the flexible substrate situated at the second part and corresponding to the sidewall.

15. The flexible printed circuit board according to claim 14, wherein the opening of the insulating layer is a rectangular opening disposed at a central position of the flexible substrate at the second part and corresponding to a central position of the sidewall.

16. The flexible printed circuit board according to claim 14, wherein the insulating layer is further attached to at least a part of the second surface of the flexible substrate.

17. The flexible printed circuit board according to claim 16, further comprising a plurality of electronic elements disposed on the part of the second surface of the flexible substrate where the insulating layer is located.

18. The flexible printed circuit board according to claim 13, wherein the flexible substrate is a single-layered flexible substrate.

19. The flexible printed circuit board according to claim 18, wherein the insulating layer comprises a polyimide film.

* * * * *